United States Patent
Kim et al.

(10) Patent No.: US 10,074,754 B2
(45) Date of Patent: Sep. 11, 2018

(54) SOLAR CELL

(71) Applicant: SAMSUNG SDI CO., LTD., Yongin-si, Gyeonggi-do (KR)

(72) Inventors: JuHee Kim, Uiwang-si (KR); Dong Suk Kim, Uiwang-si (KR); Seok Hyun Jung, Uiwang-si (KR); Min Jae Kim, Uiwang-si (KR); SeakCheol Kim, Uiwang-si (KR); Sang Hyun Yang, Uiwang-si (KR); Je Il Lee, Uiwang-si (KR)

(73) Assignee: Samsung SDI Co., Ltd., Yongin-Si, Gyeonggi-do (KR)

( * ) Notice: Subject to any disclaimer, the term of this patent is extended or adjusted under 35 U.S.C. 154(b) by 0 days.

(21) Appl. No.: 14/804,368

(22) Filed: Jul. 21, 2015

(65) Prior Publication Data

US 2016/0056311 A1 Feb. 25, 2016

(30) Foreign Application Priority Data

Aug. 20, 2014 (KR) ........................ 10-2014-0108621

(51) Int. Cl.
*H01L 31/0224* (2006.01)
*H01L 31/0236* (2006.01)
(Continued)

(52) U.S. Cl.
CPC ....... *H01L 31/022425* (2013.01); *H01B 1/22* (2013.01); *H01L 31/02168* (2013.01);
(Continued)

(58) Field of Classification Search
CPC ......... H01L 31/02618; H01L 31/02366; H01L 31/02008; H01L 31/0512;
(Continued)

(56) References Cited

U.S. PATENT DOCUMENTS 8,759,668 B2 6/2014 Salami et al.
2011/0094578 A1* 4/2011 Akimoto ......... H01L 31/022425
136/256

(Continued)

FOREIGN PATENT DOCUMENTS

CN 103594140 A 2/2014
CN 103702794 A 4/2014
(Continued)

OTHER PUBLICATIONS

Korean Office Action dated Apr. 14, 2016 in Corresponding Korean Patent Application No. 10-2014-0108621.
(Continued)

*Primary Examiner* — Matthew T Martin
(74) *Attorney, Agent, or Firm* — Lee & Morse, P.C.

(57) ABSTRACT

A solar cell, including a substrate; and an electrode on at least one surface of the substrate. The electrode may be prepared from an electrode paste including tungsten oxide particles, and the electrode may have an adhesive strength of about 4 N/mm to about 6 N/mm with respect to a ribbon for interconnecting solar cells, as measured under conditions of a peeling angle of 180° and a stretching rate of 50 mm/min.

12 Claims, 3 Drawing Sheets

(51) Int. Cl.
  *H01L 31/0216* (2014.01)
  *H01B 1/22* (2006.01)
  *H01L 31/02* (2006.01)
  *H01L 31/05* (2014.01)

(52) U.S. Cl.
  CPC .. *H01L 31/02366* (2013.01); *H01L 31/02008* (2013.01); *H01L 31/02021* (2013.01); *H01L 31/0512* (2013.01); *Y02E 10/50* (2013.01)

(58) Field of Classification Search
  CPC ...... H01L 31/022425; H01L 31/02021; H01B 1/22; Y02E 10/50; H05K 1/096
  USPC ........................................................ 136/256
  See application file for complete search history.

(56) References Cited

U.S. PATENT DOCUMENTS

| | | | |
|---|---|---|---|
| 2013/0042912 A1 | 2/2013 | Kurihara et al. | |
| 2013/0160830 A1* | 6/2013 | Ionkin | H01B 1/22 |
| | | | 136/256 |
| 2013/0284250 A1* | 10/2013 | Hang | H01B 1/22 |
| | | | 136/256 |
| 2014/0042375 A1* | 2/2014 | Kim | C03C 8/10 |
| | | | 252/514 |
| 2015/0075597 A1* | 3/2015 | Kurtz | H01L 31/02008 |
| | | | 136/256 |

FOREIGN PATENT DOCUMENTS

| | | |
|---|---|---|
| KR | 10-2012-0003732 A | 1/2012 |
| TW | 201120163 A | 6/2011 |
| TW | 201431819 A | 8/2014 |
| WO | WO 2013/188485 A1 | 12/2013 |

OTHER PUBLICATIONS

Korean Office Action dated May 23, 2016, in Corresponding Korean Patent Application No. 10-2014-0108621.

Chinese Office Action dated Aug. 23, 2016 in Corresponding Chinese Patent Application No. 201510471373.1.

Taiwanese Office Action dated May 25, 2016.

\* cited by examiner

SOLAR CELL

CROSS-REFERENCE TO RELATED APPLICATION

Korean Patent Application No. 10-2014-0108621, filed on Aug. 20, 2014, in the Korean Intellectual Property Office, and entitled: "Solar Cell," is incorporated by reference herein in its entirety.

BACKGROUND

1. Field

Embodiments relate to a solar cell.

2. Description of the Related Art

Solar cells may generate electric energy using the photovoltaic effect of a PN junction which may convert photons of sunlight into electricity. In the solar cell, front and rear electrodes may be formed on upper and lower surfaces of a semiconductor wafer or substrate with the PN junction, respectively. Then, the photovoltaic effect of the PN junction may be induced by sunlight entering the semiconductor wafer and electrons generated by the photovoltaic effect of the PN junction may provide electric current to the outside through the electrodes.

SUMMARY

Embodiments may be realized by providing a solar cell, including a substrate; and an electrode on at least one surface of the substrate. The electrode may be prepared from an electrode paste including tungsten oxide particles, and the electrode may have an adhesive strength of about 4 N/mm to about 6 N/mm with respect to a ribbon for interconnecting solar cells, as measured under conditions of a peeling angle of 180° and a stretching rate of 50 mm/min.

The electrode may be a front electrode or a rear electrode; and the substrate may include an anti-reflection film and the front electrode sequentially formed on a front surface of the substrate or the substrate includes a back surface field layer and the rear electrode sequentially formed on a back surface of the substrate.

The substrate may have a PN junction therein.

The tungsten oxide particles may have an average particle diameter (D50) of about 0.1 µm to about 5 µm before baking.

The substrate may have a textured structure on a front surface thereof.

The electrode paste may include silver (Ag) powder; glass frit; the tungsten oxide particles; and an organic vehicle.

The tungsten oxide particles may be present in an amount of about 0.1 wt % to about 1.0 wt % based on a total weight of the electrode paste.

The glass frit may be a Bi—Te—O-based glass frit containing elemental bismuth (Bi) and elemental tellurium (Te); the Bi—Te—O-based glass fit may contain about 25 mol % to about 85 mol % of the elemental tellurium (Te); and a mole ratio of the elemental bismuth (Bi) to the elemental tellurium (Te) in the Bi—Te—O-based glass fit may range from about 1:0.1 to about 1:50.

The Bi—Te—O-based glass fit further may include one or more of lithium (Li), phosphorus (P), germanium (Ge), gallium (Ga), cerium (Ce), iron (Fe), silicon (Si), zinc (Zn), tungsten (W), magnesium (Mg), cesium (Cs), strontium (Sr), molybdenum (Mo), titanium (Ti), tin (Sn), indium (In), vanadium (V), barium (Ba), nickel (Ni), copper (Cu), sodium (Na), potassium (K), arsenic (As), cobalt (Co), zirconium (Zr), manganese (Mn), or aluminum (Al).

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
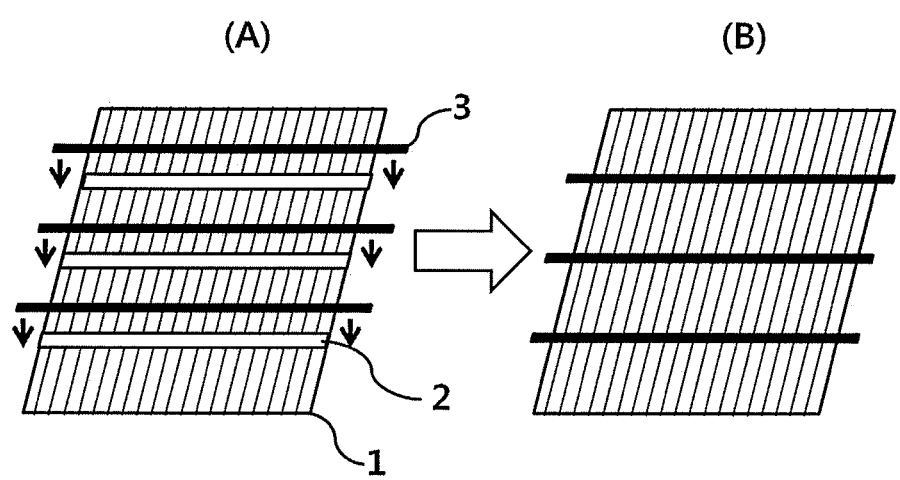
FIG. 1 illustrates a conceptual view of a method of connecting a cell to a ribbon in a solar cell.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Solar Cell

Hereinafter, a solar cell according to embodiments will be described with reference to the accompanying drawings.

Figure 2:
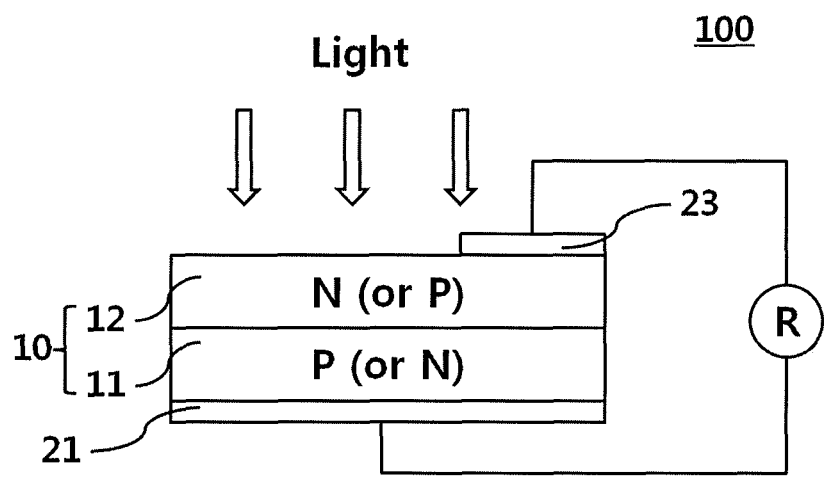
FIG. 2 illustrates a schematic view of a solar cell according to one embodiment.

FIG. 2 illustrates a schematic view of a solar cell according to one embodiment. Referring to FIG. 2, a solar cell 100 according to this embodiment may include a substrate 10, a front electrode 23 formed on a front surface of the substrate 10, and a rear electrode 21 formed on a back surface of the substrate 10.

In this embodiment, the substrate 10 may be a substrate having a PN junction therein. For example, the substrate 10 may include a semiconductor substrate 11 and an emitter 12. For example, the substrate 10 may be a substrate wherein an n-type emitter 12 is formed on one surface of a p-type semiconductor substrate 11. In an embodiment, the substrate 10 may be a substrate wherein a p-type emitter 12 is formed on one surface of an n-type semiconductor substrate 11. The semiconductor substrate 11 may refer to a p-type substrate or an n-type substrate. The p-type substrate may be a semiconductor substrate 11 doped with a p-type dopant, and the n-type substrate may be a semiconductor substrate 11 doped with an n-type dopant.

In descriptions of, for example, the substrate 10 and the semiconductor substrate 11, a surface receiving incident light will be referred to as a front surface (light-receiving surface), and a surface opposite the front surface will be referred to as a back surface.

In this embodiment, the semiconductor substrate 11 may be formed of a crystalline silicon semiconductor or a compound semiconductor. The crystalline silicon may be monocrystalline or polycrystalline silicon. For example, as the crystalline silicon, a silicon wafer may be used.

The p-type dopant may be a material including a group III element such as boron, aluminum, or gallium. The n-type dopant may be a material including a group V element, such as phosphorus, arsenic, or antimony.

The rear electrode 21 or the front electrode 23 formed on the surface of the substrate 10 may be formed from an electrode paste to be described below. For example, the electrode may be formed by printing and baking the electrode paste on the substrate.

The solar cell according to this embodiment may include an electrode, which may be formed from a paste for solar cell electrodes including tungsten oxide ($WO_3$) particles. The electrode may have an adhesive strength of about 4 N/mm to about 6 N/mm with respect to ribbons, as measured under conditions of a peeling angle of 180° and a stretching rate of 50 mm/min. As a result, the solar cell may exhibit excellent conversion efficiency.

Figure 3:
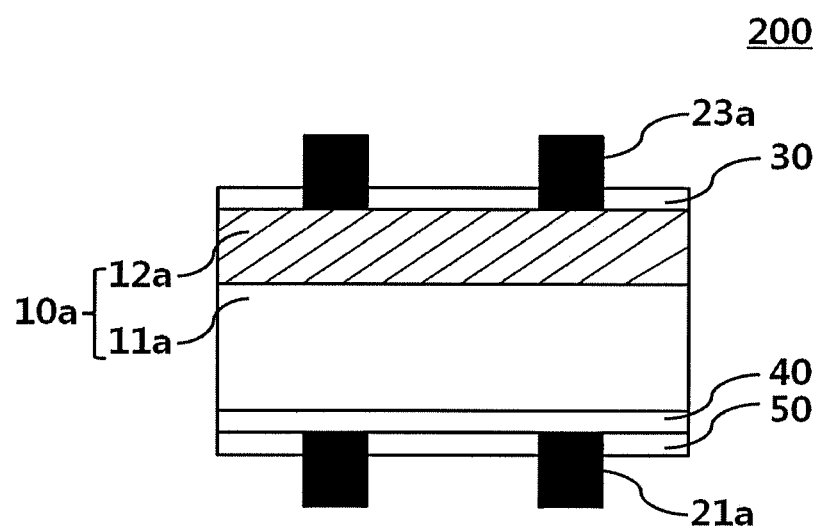
FIG. 3 illustrates a schematic view of a solar cell according to an embodiment.

FIG. 3 illustrates a schematic view of a solar cell 200 according to an embodiment. Referring to FIG. 3, a solar cell according to this embodiment may include a substrate 10a obtained by forming an emitter 12a on a front surface of a semiconductor substrate 11a. The substrate 10a may have an anti-reflection film 30 and a front electrode 23a formed on a front surface thereof. The substrate 10a may have a back surface field layer 40, an anti-reflection film 50, and a rear electrode 21a sequentially formed on a back surface thereof. The front electrode 23a or the rear electrode 21a may be formed in a bus bar pattern.

Hereinafter, for convenience of description, each component will be described with the assumption that the semiconductor substrate 11a is a p-type substrate. In an embodiment, the semiconductor substrate 11a may be an n-type substrate.

One surface of the p-type substrate 11a may be doped with an n-type dopant to form an n-type emitter 12a, and a PN junction may be formed at an interface between the semiconductor substrate and the emitter. Electrons generated in the PN junction may be collected by the front electrode 23a.

The substrate 10a may have a textured structure on a front surface thereof. The textured structure may be formed by surface treatment of the front surface of the substrate 10a using a method known in the art, such as etching. The textured structure may serve to condense light entering the front surface of the substrate. The textured structure may have, for example, a pyramidal shape, a square honeycomb shape, and a triangular honeycomb shape, and the textured structure may allow an increased amount of light to reach the PN junction and may reduce reflectance of the light, while minimizing optical loss.

The p-type substrate may be formed on a back surface thereof with a back surface field (BSF) layer 40 that may be capable of inducing back surface field (BSF) effects.

The back surface field layer 40 may be formed by doping the back surface of the p-type semiconductor substrate 11a with a high concentration of p-type dopant. The back surface field layer 40 may have a higher doping concentration than the p-type semiconductor substrate 11a, which may result in a potential difference between the back surface field layer 40 and the p-type semiconductor substrate 11a. This may make it difficult for electrons generated in the p-type semiconductor substrate 11a to shift towards the back surface thereof so as to prevent recombination with metals, and electron loss may be reduced. As a result, both open circuit voltage (Voc) and fill factor may be increased, and solar cell efficiency may be improved.

The first anti-reflection film 30 and/or the second anti-reflection film 50 may be formed on an upper surface of the n-type emitter 12a and on a lower surface of the back surface field layer 40, respectively.

The first and second anti-reflection films 30, 50 may reduce reflectance of light while increasing absorption of light at a specific wavelength. The first and second anti-reflection films 30, 50 may enhance contact efficiency with silicon present on the surface of the substrate 10a, and solar cell efficiency may be improved. Accordingly, the first and second anti-reflection films 30, 50 may include a material that may reflect less light and may exhibit electric insulation. The first and second anti-reflection films 30, 50 may have a convex/concave structure on the surface thereof, or may have the same form as that of the textured structure formed on the substrate, and return loss of incident light may be reduced.

The first and second anti-reflection films 30, 50 may include at least one selected from among, for example, oxides including aluminum oxide ($Al_2O_3$), silicon oxide ($SiO_2$), titanium oxide ($TiO_2$ or $TiO_4$), magnesium oxide (MgO), cerium oxide ($CeO_2$), or combinations thereof; nitrides including aluminum nitride (AlN), silicon nitride ($SiN_x$), titanium nitride (TiN), or combinations thereof; and oxynitrides including aluminum oxynitride (AlON), silicon oxynitride (SiON), titanium oxynitride (TiON), or combinations thereof, and it may be possible to further enhance anti-reflection efficiency.

The anti-reflection films 30, 50 may be formed by, for example, atomic layer deposition (ALD), vacuum deposition, atmospheric pressure chemical vapor deposition, and plasma enhanced chemical vapor deposition (PECVD).

In one example, the anti-reflection films 30, 50 may be formed of, for example, silicon nitride ($SiN_x$), by plasma enhanced chemical vapor deposition (PECVD). By way of another example, the anti-reflection films 30, 50 may be formed of, for example, aluminum oxide ($Al_2O_3$), by atomic layer deposition (ALD).

In one embodiment, the first anti-reflection film 30 may be formed on the front surface of the substrate 10a, and may have a mono or multilayer structure.

In an embodiment, the back surface of the p-type semiconductor substrate 11a may be doped with boron to form the back surface field layer, and the second anti-reflection film 50 may be additionally formed. The second anti-reflection film 50 may further enhance open circuit voltage.

After formation of the anti-reflection films, the front electrode 23a electrically connected to the n-type emitter layer 12a and the rear electrode 21a electrically connected to the p-type substrate 11a may be formed. The front electrode 23a may allow flow of electrons collected by the n-type emitter. The rear electrode 21a may electrically communicate with the p-type substrate and may serve as a path through which electric current flows.

In this embodiment, the front electrode 23a and the rear electrode 21a may be formed from the electrode paste.

For example, the electrode paste may be printed on the back surface of the PN junction substrate. Then, a preliminary process of preparing the rear electrode may be performed by drying at about 200° C. to about 400° C. for about 10 to 60 seconds. A preliminary process for preparing the front electrode may be performed by printing the electrode paste on the front surface of the PN junction substrate, followed by drying the printed paste. Then, the front electrode and the rear electrode may be formed by baking at about 400° C. to about 950° C., for example, at about 750° C. to about 950° C., for about 30 to 180 seconds.

By forming the front electrode or the rear electrode according to this embodiment using the electrode paste described below, it may be possible to provide excellent adhesive strength between the electrode and the ribbon. The electrode paste according to one embodiment may minimize serial resistance and enhance open circuit voltage of a solar cell, and excellent conversion efficiency may be secured.

Electrode Paste

The electrode paste may include: silver (Ag) powder; glass frits; tungsten oxide particles; and an organic vehicle.

Silver Powder

The electrode paste may include silver (Ag) powder as a conductive powder. The particle size of the silver powder may be on a nanometer or micrometer scale. For example, the silver powder may have a particle size of dozens to several hundred nanometers, or several to dozens of micrometers. In an embodiment, the silver powder may be a mixture of two or more types of silver powders having different particle sizes.

The silver powder may have, for example, a spherical, flake, or amorphous shape.

The silver powder may have an average particle diameter (D50) of about 0.1 μm to about 10 μm, for example, about 0.5 μm to about 5 μm. Within this range, the paste may provide low contact resistance and low line resistance.

The average particle diameter may be measured using a particle size analyzer Model 1064D (CILAS Co., Ltd.) after dispersing the conductive powder in isopropyl alcohol (IPA) at 25° C. for 3 minutes via ultrasonication. The silver powder may be present in an amount of about 60 wt % to about 95 wt % based on the total weight of the electrode paste. Within this range, the conductive powder may reduce resistance, and conversion efficiency may be enhanced, and formation of a paste may be advantageously achieved. For example, the silver powder may be present in an amount of about 70 wt % to about 90 wt % based on the total weight of the electrode paste.

Glass Frit

The glass frits may form silver crystal grains in an emitter region by etching the anti-reflection film during the baking process of the electrode paste, and the resistance of the solar cell may be reduced. The glass frits may serve to enhance adhesion between the conductive powder and the wafer. During the baking process, the glass frits may soften and may decrease the baking temperature.

When the area of the solar cell is increased, there may be a problem of increase in solar cell contact resistance, and it may be necessary to minimize both serial resistance and influence of increase in solar cell area on the PN junction. In addition, the glass frits may be required to secure sufficient thermal stability in order to withstand a wide range of baking temperatures.

The glass frits according to one embodiment may be Bi—Te—O-based glass frits. The Bi—Te—O-based glass frits may refer to glass frits which may originate from a metal oxide including bismuth (Bi) oxide and tellurium (Te) oxide, and may contain elemental bismuth (Bi) and elemental tellurium (Te).

The Bi—Te—O-based glass frits may include about 25 mol % to about 85 mol % of elemental tellurium (Te). The glass frits may include elemental bismuth (Bi) and elemental tellurium (Te) in a mole ratio of about 1:0.1 to about 1:50. Within this range, the glass frits may reduce serial resistance (Rs) and enhance open circuit voltage (Voc) of the electrode, and conversion efficiency of the solar cell may be improved.

In an embodiment, the glass frits may further include one or more of lithium (Li), phosphorus (P), germanium (Ge), gallium (Ga), cerium (Ce), iron (Fe), silicon (Si), zinc (Zn), tungsten (W), magnesium (Mg), cesium (Cs), strontium (Sr), molybdenum (Mo), titanium (Ti), tin (Sn), indium (In), vanadium (V), barium (Ba), nickel (Ni), copper (Cu), sodium (Na), potassium (K), arsenic (As), cobalt (Co), zirconium (Zr), manganese (Mn), or aluminum (Al).

In one embodiment, the glass frits may include about 5 wt % to about 20 wt % of bismuth oxide, about 60 wt % to about 80 wt % of tellurium oxide, about 1 wt % to about 10 wt % of zinc oxide, and about 1 wt % to about 10 wt % of lithium oxide.

For example, the content of each metal component included in the glass frits may be measured by Inductively Coupled Plasma-Optical Emission Spectrometry (ICP-OES).

The glass frits may be prepared from the metal oxides as set forth above by a method known in the art. For example, the metal oxides may be mixed in a predetermined ratio. Mixing may be carried out using a ball mill or a planetary mill. The mixed electrode paste may be melted at 800° C. to 1300° C., followed by quenching to 25° C. The obtained resultant product may be subjected to pulverization using, for example, a disk mill or a planetary mill, and glass frits may be prepared.

The glass frits may have an average particle diameter (D50) of about 0.1 μm to about 10 μm. The glass frits may have a spherical or amorphous shape.

The glass frits may be present in an amount of about 0.1 wt % to about 20 wt %, for example, about 0.5 wt % to about 10 wt % based on the total weight of the electrode paste. Within this range, it may be possible to secure PN junction stability given varying sheet resistance. Further, it may be possible to minimize serial resistance of the electrode, and solar cell efficiency may be improved.

Tungsten Oxide Particles

A solar cell may include plural cells. A cell may be connected to adjacent cells through ribbons, e.g., interconnect wires. The ribbons may directly be attached to an electrode in the form of bus bars. If adhesive strength between the solar cell electrode and the ribbon is not sufficiently secured, there may be a concern of possible separation of cells or deterioration in reliability of the solar cell. For example, the ribbons may be interconnect wires that include tin, lead, and silver.

In the solar cell according to embodiments, the electrode may be formed from the electrode paste containing tungsten oxide particles, and the electrode may have excellent electrical properties and superior adhesive strength with respect to the ribbon.

In one embodiment, the electrode paste may include tungsten oxide ($WO_3$) particles. The tungsten oxide ($WO_3$) particles may be powdered particles or granular particles. The tungsten oxide ($WO_3$) particles may have an average particle diameter (D50) of, for example, about 0.1 μm to about 10 μm, for example, about 0.1 μm to about 5 μm, before baking. Within this range, the electrode may secure excellent adhesive strength and photoelectric conversion efficiency.

The tungsten oxide particles may be present in an amount of about 0.1 wt % to about 1.0 wt % based on the total weight of the electrode paste. Within this range, precise patterns may be formed during etching of the electrode. In addition, it may be possible to enhance open circuit voltage of the electrode while securing excellent adhesive strength.

(D) Organic Vehicle

The organic vehicle may impart suitable viscosity and rheological characteristics for printing to the electrode paste through mechanical mixing with the inorganic component of the paste.

The organic vehicle may be an organic vehicle used in an electrode paste and may include, for example, a binder resin and a solvent.

The binder resin may be selected from acrylate resins or cellulose resins. Ethyl cellulose may be used as the binder resin. The binder resin may be selected from, for example, ethyl hydroxyethyl cellulose, nitrocellulose, blends of ethyl cellulose and phenol resins, alkyd resins, phenol resins, acrylate ester resins, xylene resins, polybutene resins, polyester resins, urea resins, melamine resins, vinyl acetate resins, wood rosin, and polymethacrylates of alcohols.

The solvent may be selected from, for example, hexane, toluene, ethyl cellosolve, cyclohexanone, butyl cellosolve, butyl carbitol (diethylene glycol monobutyl ether), dibutyl carbitol (diethylene glycol dibutyl ether), butyl carbitol acetate (diethylene glycol monobutyl ether acetate), propylene glycol monomethyl ether, hexylene glycol, terpineol, methylethylketone, benzylalcohol, γ-butyrolactone, ethyl lactate, and combinations thereof. These solvents may be used alone or in combination thereof.

The organic vehicle may be present in an amount of about 1 wt % to about 30 wt % based on the total weight of the electrode paste. Within this range, the organic vehicle may provide sufficient adhesive strength and excellent printability to the paste.

(E) Additives

The electrode paste may further include additives to enhance fluidity and process properties and stability. The additives may include, for example, dispersants, thixotropic agents, plasticizers, viscosity stabilizers, anti-foaming agents, pigments, UV stabilizers, antioxidants, and coupling agents. These additives may be used alone or as mixtures thereof. The additives may be present in an amount of about 0.1 wt % to about 5 wt % based on the total weight of the electrode paste. The content of the additives may be changed.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Examples 1 to 5 and Comparative Examples 1 to 2

Example 1

As an organic binder, 1.0 wt % of ethylcellulose (STD4, Dow Chemical Company) was sufficiently dissolved in 6.6 wt % of Texanol at 60° C., and 89.0 wt % of spherical silver powder (AG-4-8, Dowa Hightech Co., Ltd.) having an average particle diameter of 2.0 μm, 2.5 wt % of glass frit I prepared according to the composition as listed in Table 1, 0.1 wt % of tungsten oxide particles (99% $WO_3$ powder, Kojundo Chemicals) having an average particle diameter (D50) of 0.5 μm, 0.4 wt % of a dispersant BYK102 (BYK-Chemie), and 0.4 wt % of a thixotropic agent Thixatrol ST (Elementis Co., Ltd.) were added to the binder solution, followed by mixing and kneading in a 3-roll kneader, thereby preparing an electrode paste.

The prepared electrode paste was deposited over a front surface of crystalline multilayer wafer having a sheet resistance of 90Ω by screen-printing (printer by Microtech Inc., 325 mesh finger width 60 μm) in a predetermined pattern, followed by drying in an IR drying furnace. Then, an aluminum paste was printed on a back surface of the wafer and dried in the same manner as above. Cells formed according to this procedure were subjected to baking at 980° C. for 30 to 210 seconds in a belt-type baking furnace, and evaluated as to the following properties. Results are shown in Table 3.

Examples 2 to 5 and Comparative Examples 1 to 2

Solar cells were fabricated in the same manner as in Example 1 except that glass frits were prepared according to the composition as listed in Table 1 and electrode pastes were prepared according to the composition as listed in Table 2. The fabricated solar cells were evaluated as to the following properties. Results are shown in Table 3.

TABLE 1

| (wt %) | $Bi_2O_3$ | $TeO_2$ | $WO_3$ | ZnO | $B_2O_3$ | $Li_2O$ | $V_2O_5$ |
|---|---|---|---|---|---|---|---|
| Glass frit I | 16 | 70 | — | 7 | — | 7 | — |
| Glass frit II | 70 | 12 | 14 | — | — | 1 | 3 |

TABLE 2

| | Example | | | | | Comparative Example | |
|---|---|---|---|---|---|---|---|
| (wt %) | 1 | 2 | 3 | 4 | 5 | 1 | 2 |
| Silver (Ag) powder | 89.0 | 89.0 | 89.0 | 89.0 | 89.0 | 89.0 | 86.3 |
| Tungsten oxide particles | 0.1 | 0.2 | 0.3 | 0.4 | 0.5 | — | — |
| Glass frit I | 2.5 | 2.5 | 2.5 | 2.5 | 2.5 | 2.5 | — |
| Glass frit II | — | — | — | — | — | — | 3.5 |
| Organic vehicle: Binder | 1.0 | 1.0 | 1.0 | 1.0 | 1.0 | 1.0 | 1.0 |
| Organic vehicle: Solvent | 6.6 | 6.5 | 6.4 | 6.3 | 6.2 | 6.7 | 8.5 |
| Additives | 0.8 | 0.8 | 0.8 | 0.8 | 0.8 | 0.8 | 0.7 |

Measurement Method of Serial Resistance, Conversion Efficiency, and Open Circuit Voltage The solar cell was evaluated as to serial resistance (Rs), conversion efficiency (%), and open circuit voltage (mV) using a solar cell efficiency tester CT-801 (Pasan Co., Ltd.).

Measurement Method of Adhesive Strength

Flux (952S, Kester Corporation) was applied to the prepared electrode and bonded to ribbons (62Sn/36Pb/2Ag, thickness 0.18 mm, width 1.5 mm; TM-A, Shenzhen Huaguang Tech. Co., Ltd.) at 350° C. using a soldering iron (Hakko Co., Ltd.). Then, the resultant product was evaluated as to adhesive strength (N/mm) at a peeling angle of 180° and a stretching rate of 50 mm/min using a tensioner (Tinius Olsen).

TABLE 3

| | Example | | | | | Comparative Example | |
|---|---|---|---|---|---|---|---|
| | 1 | 2 | 3 | 4 | 5 | 1 | 2 |
| Open circuit voltage (Voc) | 630.43 | 630.55 | 630.25 | 630.56 | 630.98 | 628.74 | 630.33 |
| Serial resistance (mΩ) | 0.00419 | 0.00408 | 0.00429 | 0.00430 | 0.00415 | 0.00440 | 0.0067 |
| Efficiency (%) | 17.617 | 17.770 | 17.647 | 17.728 | 17.727 | 17.570 | 17.410 |
| Adhesive strength (N/mm) | 4.56 | 4.63 | 4.78 | 4.69 | 4.80 | 3.85 | 2.98 |

As shown in Table 2, the electrodes of Examples 1 to 5 were prepared from the electrode pastes containing tungsten oxide particles. In contrast, the electrodes of Comparative Examples 1 to 2 were prepared from the electrode pastes containing no tungsten oxide particles.

As shown in Table 3, the electrodes of Examples 1 to 5 had relatively low serial resistance and excellent conversion efficiency as compared with the electrodes of Comparative Examples 1 to 2. In addition, the electrodes of Examples 1 to 5 exhibited an adhesive strength as high as about 4 N/mm to about 6 N/mm with respect to the ribbon.

By way of summation and review, the electrodes of a solar cell may be formed on a wafer by applying, patterning, and baking an electrode paste.

Continuous reduction in emitter thickness for improvement of solar cell efficiency may cause shunting, which may deteriorate solar cell performance. An area of a solar cell may be increased to achieve high efficiency. However, there may be a problem of efficiency deterioration, for example, due to increase in contact resistance of the solar cell.

Referring to FIG. 1, a cell 1 constituting the solar cell may be connected to adjacent cells through ribbons 3. The ribbon may be brought into direct contact with a bus bar 2, a sort of electrode. Poor adhesion between the ribbon and the electrode may cause increase in serial resistance of the electrode, and deterioration in conversion efficiency of the solar cell.

Comparative solar cells may include electrodes prepared from electrode pastes including lead-containing glass fits, and it may be difficult to guarantee sufficient adhesion between the electrode and the ribbon.

According to embodiments, it may be possible to provide an electrode paste, which may form an electrode having excellent adhesive strength with respect to ribbons. In addition, it may be possible to provide a solar cell including an electrode formed from the electrode paste. According to embodiments, it may be possible to provide a solar cell including an electrode having low serial resistance and enhanced open circuit voltage. According to embodiments, it may be possible to provide a solar cell exhibiting excellent conversion efficiency.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A solar cell, comprising:
a substrate; and
an electrode on at least one surface of the substrate, wherein:
the electrode is prepared from an electrode paste including tungsten oxide particles, silver powder, a glass frit, and an organic vehicle,
the tungsten oxide particles are present in an amount of about 0.1 wt % to about 1.0 wt % based on a total weight of the electrode paste,
the silver powder is present in an amount of about 60 wt % to about 95 wt % based on the total weight of the electrode paste,
glass fit includes about 5 wt % to 20 wt % of bismuth oxide, tellurium oxide, and 1 to 7 wt % of lithium oxide, the tellurium oxide and bismuth oxide being present in a combined amount of at least 85 wt % in the glass frit and a weight ratio of tellurium oxide to bismuth oxide in the glass frit being at least 4, and
the electrode has an adhesive strength of about 4 N/mm to about 6 N/mm with respect to a ribbon for interconnecting solar cells, as measured under conditions of a peeling angle of 180° and a stretching rate of 50 mm/min.

2. The solar cell as claimed in claim 1, wherein:
the electrode is a front electrode or a rear electrode; and
the substrate includes an anti-reflection film and the front electrode sequentially formed on a front surface of the substrate or the substrate includes a back surface field layer and the rear electrode sequentially formed on a back surface of the substrate.

3. The solar cell as claimed in claim 1, wherein the substrate has a PN junction therein.

4. The solar cell as claimed in claim 1, wherein the tungsten oxide particles have an average particle diameter (D50) of about 0.1 μm to about 5 μm before baking.

5. The solar cell as claimed in claim 1, wherein the substrate has a textured structure on a front surface thereof.

6. The solar cell as claimed in claim 1, wherein:
the glass frit contains about 25 mol % to about 85 mol % of elemental tellurium; and a mole ratio of elemental bismuth to the elemental tellurium in the glass frit ranges from about 1:0.1 to about 1:50.

7. The solar cell as claimed in claim 6, wherein the glass frit further includes one or more of phosphorus, germanium, gallium, cerium, iron, silicon, zinc, tungsten, magnesium, cesium, strontium, molybdenum, titanium, tin, indium, vanadium, barium, nickel, copper, sodium, potassium, arsenic, cobalt, zirconium, manganese, or aluminum.

8. The solar cell as claimed in claim 1, wherein the organic vehicle is present in an amount of about 1 wt % to 30 wt % based on the total weight of the electrode paste.

9. The solar cell as claimed in claim 8, wherein the organic vehicle is present in an amount of about 1 wt % to 7.6 wt % based on the total weight of the electrode paste.

10. The solar cell as claimed in claim 6, wherein the organic vehicle is present in an amount of about 1 wt % to 30 wt % based on the total weight of the electrode paste.

11. The solar cell as claimed in claim 1, wherein the silver powder is present in an amount of about 70 wt % to about 90 wt % based on the total weight of the electrode paste.

12. A solar cell, comprising:
a substrate; and
an electrode on at least one surface of the substrate, the electrode being prepared from an electrode paste that includes 0.1 wt % to 0.5 wt % of tungsten oxide particles, about 70 wt % to about 90 wt % of silver powder, less than 3.5 wt % of a glass frit, and an organic vehicle, wherein:
the glass fit contains about 5 wt % to 20 wt % of bismuth oxide, more than 68 wt % of tellurium oxide, at least 5 wt % of lithium oxide, and at least 5 wt % of zinc oxide, based on the weight of the glass fit, the glass frit being lead-free, and the tellurium oxide and bismuth oxide being present in a combined amount of at least 85 wt % in the glass frit.

* * * * *